(12) United States Patent  (10) Patent No.: US 8,064,560 B2
Hunter et al.  (45) Date of Patent: Nov. 22, 2011

(54) SYSTEMS AND METHODS FOR DETECTING A SIGNAL ACROSS MULTIPLE NYQUIST BANDS

(75) Inventors: Jeffrey Kent Hunter, Olathe, KS (US); Timothy Gibson, Overland Park, KS (US)

(73) Assignee: Honeywell International Inc., Morristown, NJ (US)

( * ) Notice: Subject to any disclaimer, the term of this patent is extended or adjusted under 35 U.S.C. 154(b) by 770 days.

(21) Appl. No.: 12/026,479

(22) Filed: Feb. 5, 2008

(65) Prior Publication Data

US 2009/0196385 A1  Aug. 6, 2009

(51) Int. Cl.
   *H04L 7/00*  (2006.01)
   *H04L 27/14*  (2006.01)
   *H04L 27/06*  (2006.01)
(52) U.S. Cl. .................. 375/355; 375/326; 375/344
(58) Field of Classification Search .......... 375/224, 375/225, 355, 326, 344; 341/61
   See application file for complete search history.

(56) References Cited

U.S. PATENT DOCUMENTS

| | | | |
|---|---|---|---|
| 4,893,266 A | | 1/1990 | Deem |
| 5,099,194 A | | 3/1992 | Sanderson et al. |
| 5,099,243 A | | 3/1992 | Tsui et al. |
| 5,109,188 A | | 4/1992 | Sanderson et al. |
| 5,198,748 A | | 3/1993 | Tsui et al. |
| 5,227,987 A | * | 7/1993 | Imazawa et al. ............. 708/7 |
| 5,781,156 A | | 7/1998 | Krasner |
| 5,815,101 A | | 9/1998 | Fonte |
| 6,026,418 A | | 2/2000 | Duncan, Jr. |
| 6,031,869 A | | 2/2000 | Priebe et al. |
| 6,301,545 B1 | | 10/2001 | Brodie |
| 6,337,885 B1 | | 1/2002 | Hellberg |
| 7,171,175 B2 | | 1/2007 | Lahti et al. |
| 7,498,966 B2 | | 3/2009 | Hunter et al. |
| 2006/0227898 A1 | | 10/2006 | Gibson et al. |
| 2006/0239389 A1 | * | 10/2006 | Coumou .................. 375/346 |
| 2007/0086544 A1 | | 4/2007 | Fudge et al. |

FOREIGN PATENT DOCUMENTS

| | | |
|---|---|---|
| GB | 2062395 | 5/1981 |
| GB | 2349783 | 11/2000 |

OTHER PUBLICATIONS

Bostaman et al., "Experimental Investigation of Undersampling for Adjacent Channel Interference Cancellation Scheme", "IEEE 16th Symposium on Personal, Indoor and Mobile Radio Communications", 2005, pp. 2606-2610, Publisher: IEEE.
European Patent Office, "European Search Report", Mar. 31, 2010, Published in: EP.
Bartley, "The Practicality of Processing Undersampled Waveforms", Apr. 15, 1981, pp. 199-200.

* cited by examiner

*Primary Examiner* — Young T. Tse
(74) *Attorney, Agent, or Firm* — Fogg & Powers LLC

(57) ABSTRACT

Systems and methods for detecting a signal across multiple Nyquist bands. The systems include an analog to digital converter (ADC), a clock signal generator configured to output a sample clock signal to the ADC, and a processor configured to process sampled signals and control the clock signal generator. The processor is configured to iteratively identify a desired signal, determine whether a possible interfering signal exists at a next sampling rate, and instruct the clock signal generator to generate the next sampling rate if the processor determines that a possible interfering signal does not exist. The methods include sampling an input signal at a first sampling rate, processing the sampled signal to extract information from a desired signal, determining whether a possible interfering signal exists at a next sampling rate, and sampling at the next sampling rate if it is determined that a possible interfering signal does not exist.

17 Claims, 4 Drawing Sheets

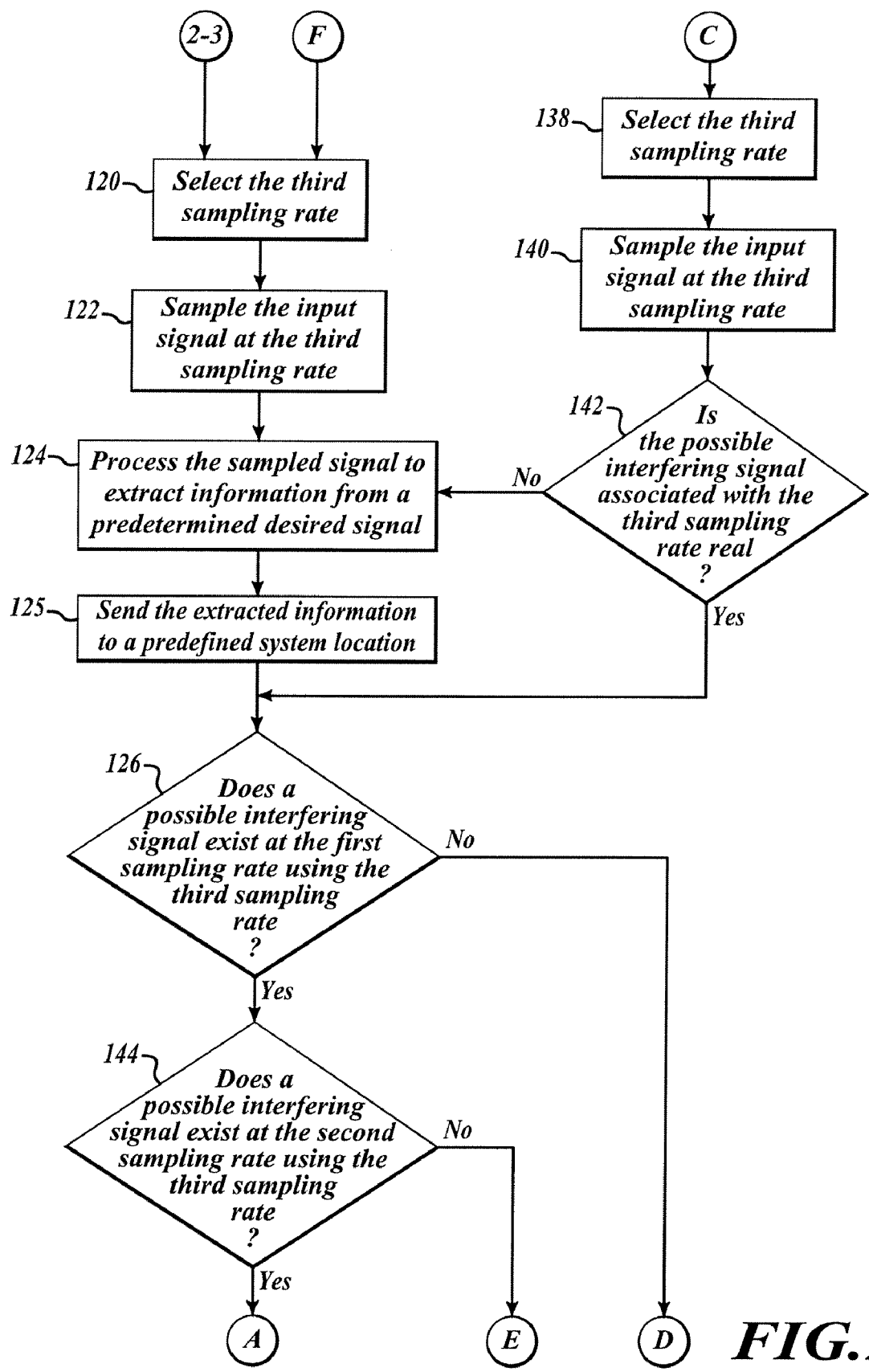

SYSTEMS AND METHODS FOR DETECTING A SIGNAL ACROSS MULTIPLE NYQUIST BANDS

BACKGROUND OF THE INVENTION

Distance Measuring Equipment (DME) systems use channels spread out over a frequency range larger than can be sampled simultaneously by analog to digital converters with sufficient dynamic range. Traditional DME radios use a conventional single channel receiver using analog mixing and filtering, or must at least use analog techniques to select only a subset of all the DME channels prior to analog to digital conversion.

SUMMARY OF THE INVENTION

The present invention includes a system for detecting a signal across multiple Nyquist bands of an analog to digital converter. In an example, the system includes an analog to digital converter (ADC) configured to sample an input signal, a clock signal generator configured to output a sample clock signal to the ADC, and a processor configured to process sampled signals and control the clock signal generator. The processor is configured to iteratively identify a desired signal, determine whether a possible interfering signal exists at a next sampling rate, and instruct the clock signal generator to generate the next sampling rate if the processor determines that a possible interfering signal does not exist.

In accordance with other aspects of the invention, the processor is further configured to process the sampled signal to identify a predetermined narrowband frequency.

In accordance with still further aspects of the invention, the processor is further configured to determine whether a possible interfering signal exists by being configured to search for aliases of possible interferers using the currently selected sampling rate.

In accordance with yet other aspects of the invention, the clock signal generator includes a switch controlled by the processor and a plurality of clock oscillators in signal communication with the switch such that the switch selectively outputs one of the clock oscillator signals to the ADC.

In accordance with yet other aspects of the invention, the invention includes a method for detecting a signal across multiple Nyquist bands. In an example, the method includes sampling an input signal at a first sampling rate, processing the sampled signal to extract information from a desired portion of the sampled signal, determining whether a possible interfering signal exists at a next sampling rate, and sampling at the next sampling rate if a processor determines that a possible interfering signal does not exist.

In accordance with other aspects of the invention, processing the sampled signal includes processing the sampled signal to identify a distance measuring equipment (DME) signal.

As will be readily appreciated from the foregoing summary, the invention provides systems and methods for detecting a signal across multiple Nyquist bands.

BRIEF DESCRIPTION OF THE DRAWINGS

Preferred and alternative embodiments of the present invention are described in detail below with reference to the following drawings:

FIGS. 2-1 through 2-3 are flowcharts of an example method of detecting a signal performed by the system shown in FIG. 1.

DETAILED DESCRIPTION OF THE PREFERRED EMBODIMENT

Figure 1:
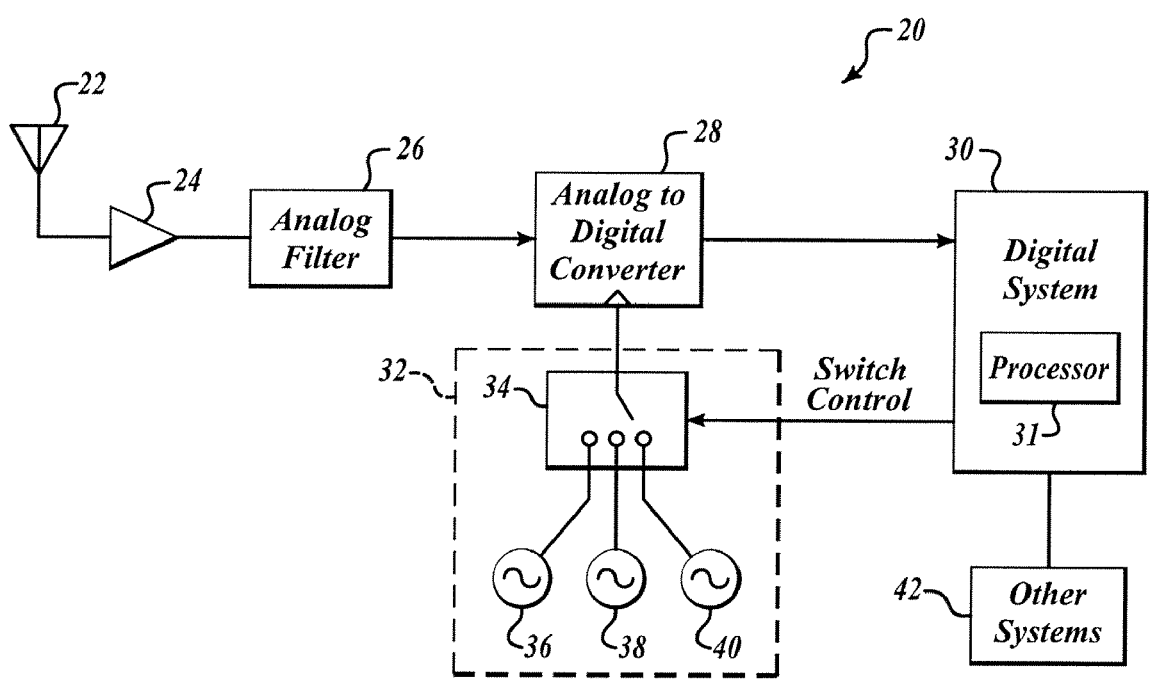
FIG. 1 is a block diagram of a system formed in accordance with an embodiment of the invention.

FIG. 1 is a block diagram of a system 20 formed in accordance with an embodiment of the invention. In an example, the system 20 includes an antenna 22 in signal communication with an amplifier 24. The amplifier 24 is in signal communication with an input of an analog filter 26. An output of the filter 26 is in signal communication with an input of an analog to digital converter (ADC) 28. An output of the ADC 28 is in signal communication with a digital system 30 that includes at least a processor 31. A sampling rate of the ADC 28 is driven by a clock signal generator 32 that is in signal communication with a clock input of the ADC 28. In an example, the clock signal generator 32 includes a switch 34 that is in signal communication with and controlled by the digital system 30. A first oscillator clock 36 having a first frequency Fs1, a second oscillator clock 38 having a second frequency Fs2, and a third oscillator clock 40 having a third frequency Fs3 are each in signal communication with the switch 34. The switch 34 is configured to selectively connect an output of one of the oscillator clocks 36, 38, 40 to the clock input of the ADC 28. In an example, the system 20 is in signal communication with other external systems 42 so that information may be passed between the digital system 30 and the external systems 42.

In an example, the system 20 receives a signal at the antenna 22, amplifies the signal at the amplifier 24, and filters the amplified signal at the filter 26. The ADC 28 samples the amplified, filtered input signal using a sample rate determined by the digital system 30 and the sample clock generator 32. Generally, the filter 26 is configured to pass at least two Nyquist bands of a signal sampled by the ADC 28. The sampled signal passes to the digital system 30, where the processor 31 is configured to identify a predetermined desired signal, determine whether a possible interfering signal exists at a next sampling rate selected from the plurality of sampling rates using the currently selected sampling rate, and instruct the clock signal generator 32 to generate the next sampling rate if the processor 31 determines that a possible interfering signal does not exist. In an example, identifying a predetermined desired signal includes extracting information from a portion of the sampled signal. If the processor 31 determines that a possible interfering signal does exist, the processor 31 is configured to determine whether a possible interfering signal exists at each of the other sampling rates selected from the plurality of sampling rates using the currently selected sampling rate until a sampling rate is found that does not have a possible interfering signal, and instruct the clock signal generator 32 to generate the sampling rate that was determined to not have a possible interfering signal, if the processor 31 determines that such a sampling rate exists. In an example, the processor 31 is generally configured to repetitively perform the preceding steps.

In an example, the system 20 is a distance measuring equipment (DME) system for detecting a DME signal across multiple Nyquist bands. In this example, the processor 31 is configured to identify a predetermined desired DME signal.

Figures 1, 2:
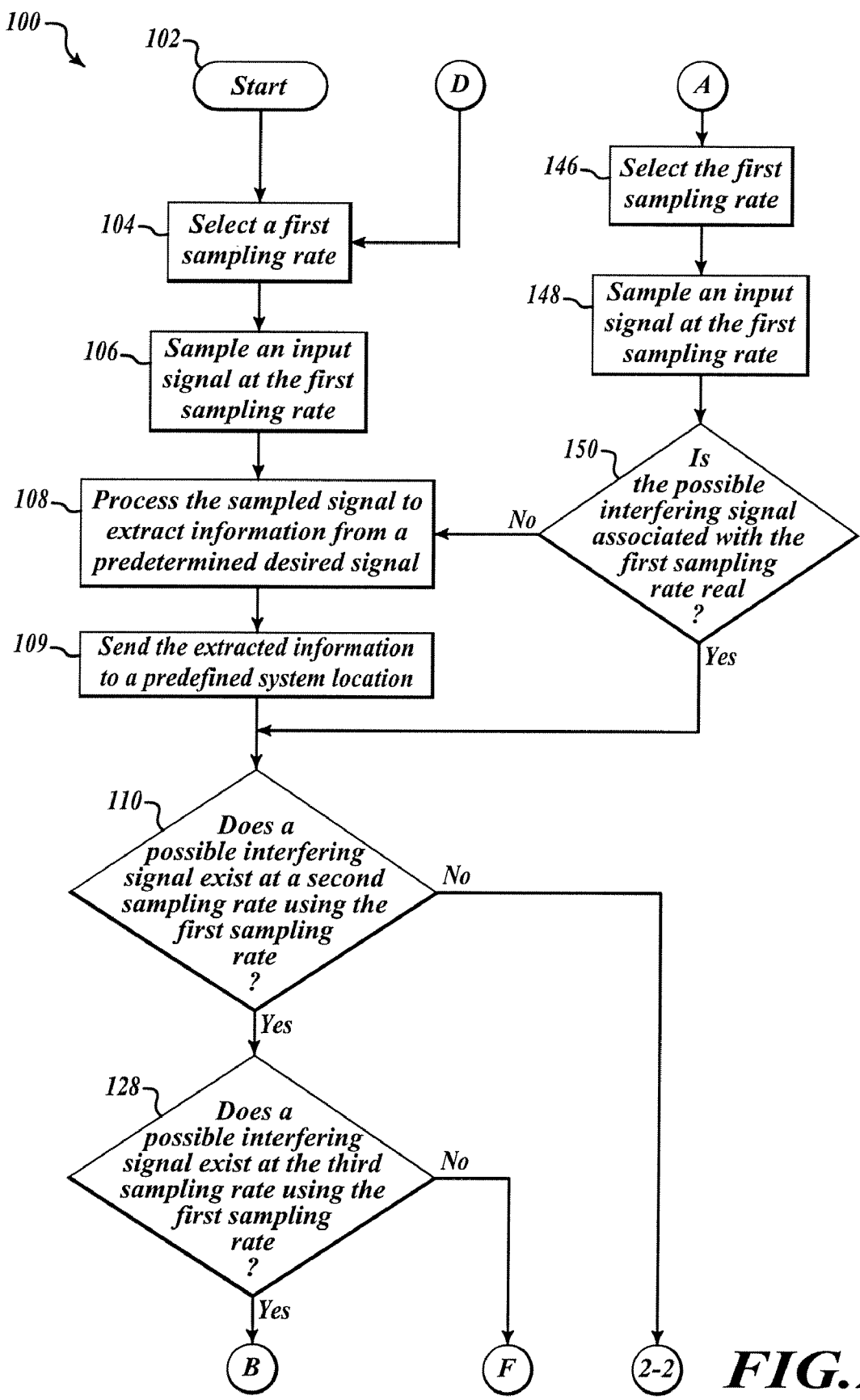
Figure 2:
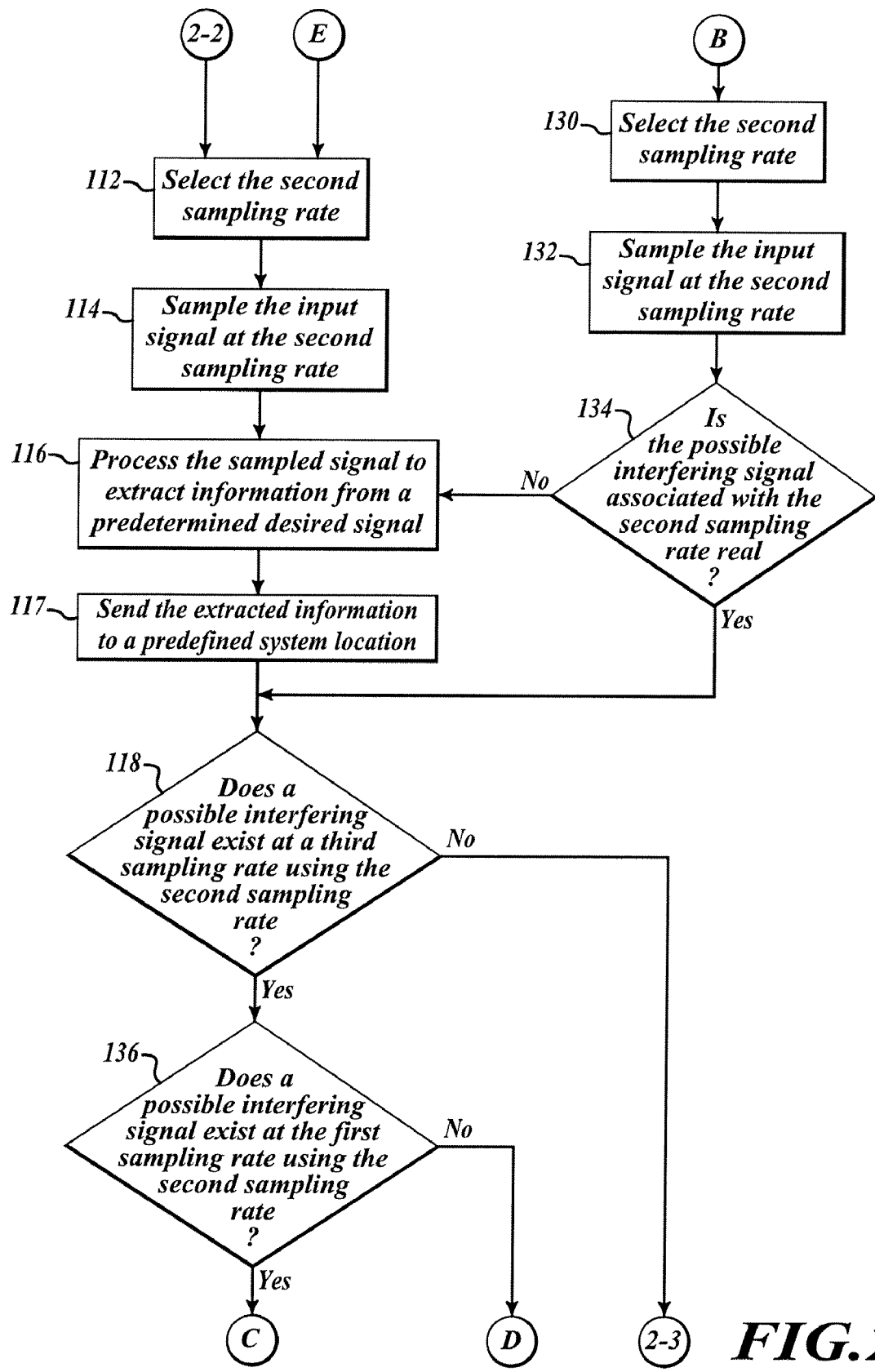

FIGS. 2-1 through 2-3 are flowcharts of an example method 100 of detecting a signal in accordance with an embodiment of the invention. Referring to FIG. 2-1, a start block 102 indicates a point at which the method 100 begins in an example embodiment. First, at a block 104, a first sampling rate is selected. This might be a sampling rate corresponding to a frequency of Fs1 from the first oscillator clock 36 shown in FIG. 1, for example. Next, at a block 106, an input signal is sampled at the first sampling rate. In an example, the input signal is the signal output from the filter 26 and is sampled by the ADC 28. Next, at a block 108, the sampled signal is processed by the processor 31 to extract information from a predetermined desired portion of the sampled input signal, such as a desired signal, for example. The predetermined desired portion may be a digitally modulated channel, an analog modulated channel, or a particular pulse pattern at a given channel frequency, for example. In an example, the processor 31 performs the sampled signal processing. Next, at a block 109, the extracted information is sent to a predefined system location for further processing and/or output. The predefined system location may be a component of the digital system 30 or one or more of the other systems 42, for example. Next, at a decision block 110, the processor 31 determines whether a possible signal that interferes with the desired portion exists at a second sampling rate using the first sampling rate. In an example, the second sampling rate corresponds to a frequency of Fs2 from the second oscillator clock 38 shown in FIG. 1 and the processor 31 is configured to determine whether the possible interfering signal exists.

If, at the decision block 110, the processor 31 determines that an interfering signal does not exist at the second sampling rate, the method 100 proceeds to a block 112 shown on FIG. 2-2 where the second sampling rate is selected. In an example, the second sampling rate is selected by the processor 31 directing the switch 34 to change from the first oscillator clock 36 at frequency Fs1 to the second oscillator clock 38 at frequency Fs2 as an output to the ADC 28. Next, at a block 114, the input signal is sampled at the second sampling rate. Then, at a block 116, the sampled signal is processed by the processor 31 to extract information from a predetermined desired portion of the sampled input signal. Next, at a block 117, the extracted information is sent to a predefined system location for further processing and/or output. The predefined system location may be a component of the digital system 30 or one or more of the other systems 42, for example. Next, at a decision block 118, the processor 31 determines whether a possible signal that interferes with the desired portion exists at a third sampling rate using the second sampling rate. In an example, the third sampling rate corresponds to a frequency of Fs3 from the third oscillator clock 40 shown in FIG. 1 and the processor 31 is configured to determine whether the possible interfering signal exists.

If, at the decision block 118, the processor determines that an interfering signal does not exist at the third sampling rate, the method 100 proceeds to a block 120 shown on FIG. 2-3 where the third sampling rate is selected. In an example, the third sampling rate is selected by the processor 31 directing the switch 34 to change from the second oscillator clock 38 at frequency Fs2 to the third oscillator clock 40 at frequency Fs3 as an output to the ADC 28. Next, at a block 122, the input signal is sampled at the third sampling rate. Then, at a block 124, the sampled signal is processed by the processor 31 to extract information from a predetermined desired portion of the sampled input signal, such as a desired signal for example. Next, at a block 125, the extracted information is sent to a predefined system location for further processing and/or output. The predefined system location may be a component of the digital system 30 or one or more of the other systems 42, for example. Next, at a decision block 126, the processor 31 determines whether a possible signal that interferes with the desired portion exists at the first sampling rate using the third sampling rate. In an example, the processor 31 is configured to determine whether the possible interfering signal exists. If, at the decision block 126, the processor 31 determines that an interfering signal does not exist at the first sampling rate, the method 100 returns to the block 104 shown on FIG. 2-1 as indicated by a connector D.

If, at the decision block 110 shown on FIG. 2-1, the processor 31 determines that the possible interfering signal exists at the second sampling rate, the method 100 proceeds to a decision block 128 where the processor 31 determines whether a possible signal that interferes with the desired portion exists at the third sampling rate using the first sampling rate. If the processor 31 determines at the decision block 128 that the possible interfering signal does not exist at the third sampling rate, the method 100 proceeds to the block 120 shown on FIG. 2-3 as indicated by a connector F. If the processor 31 determines at the decision block 128 that the possible interfering signal exists at the third sampling rate, the method 100 proceeds to a block 130 shown on FIG. 2-2, as indicated by a connector B, where the second sampling rate is selected in similar fashion to that described with respect to the block 112. Next, at a block 132, the input signal is sampled at the second sampling rate. Next, at a decision block 134, the processor 31 determines whether the possible interfering signal is real.

In an example, the processor 31 is configured to perform the determination at the decision block 134 by determining whether an amount of energy associated with the possible interfering signal using the first sampling rate as determined by the processor 31 in the decision block 110 has moved to a non-interfering signal using the second sampling rate. If the energy associated with the possible interfering signal has moved to a non-interfering signal, the processor 31 determines that the possible interfering signal is not real. If the energy associated with the interfering signal is still associated with an interfering signal, the processor 31 determines that the possible interfering signal is real. If the processor 31 determines that the possible interfering signal is not real, the method 100 proceeds to the block 116. If the processor 31 determines that the possible interfering signal is real, the method 100 proceeds to the block decision 118.

If, at the decision block 118, the processor 31 determines that the possible interfering signal exists at the third sampling rate, the method 100 proceeds to a decision block 136 where the processor 31 determines whether a possible signal that interferes with the desired portion exists at the first sampling rate using the second sampling rate. If the processor 31 determines at the decision block 136 that the possible interfering signal does not exist at the first sampling rate, the method 100 proceeds to the block 104 shown on FIG. 2-1 as indicated by a connector D. If the processor 31 determines at the decision block 136 that the possible interfering signal exists at the first sampling rate, the method 100 proceeds to a block 138 shown on FIG. 2-3, as indicated by a connector C, where the third sampling rate is selected in similar fashion to that described with respect to the block 120. Next, at a block 140, the input signal is sampled at the third sampling rate. Next, at a decision block 142, the processor 31 determines whether the possible interfering signal is real.

In an example, the processor 31 is configured to perform the determination at the decision block 142 by determining whether an amount of energy associated with the possible interfering signal using the second sampling rate as determined in the decision block 118 has moved to a non-interfering signal using the third sampling rate. If the energy associated with the possible interfering signal has moved to a non-interfering signal, the processor 31 determines that the possible interfering signal is not real. If the energy associated with the interfering signal is still associated with an interfering signal, the processor 31 determines that the possible interfering signal is real. If the processor 31 determines that the possible interfering signal is not real, the method 100 proceeds to the block 124. If the processor 31 determines that the possible interfering signal is real, the method 100 proceeds to the decision block 126.

If, at the decision block 126, the processor 31 determines that the possible interfering signal exists at the first sampling rate, the method 100 proceeds to a decision block 144 where the processor 31 determines whether a possible signal that interferes with the desired portion exists at the second sampling rate using the third sampling rate. If the processor 31 determines at the decision block 144 that the possible interfering signal does not exist at the second sampling rate, the method 100 proceeds to the block 112 shown on FIG. 2-2 as indicated by a connector E. If the processor 31 determines at the decision block 144 that the possible interfering signal exists at the second sampling rate, the method 100 proceeds to a block 146 shown on FIG. 2-1, as indicated by a connector A, where the first sampling rate is selected in similar fashion to that described with respect to the block 104. Next, at a block 148, the input signal is sampled at the first sampling rate. Next, at a decision block 150, the processor 31 determines whether the possible interfering signal is real.

In an example, the processor 31 is configured to perform the determination at the decision block 150 by determining whether an amount of energy associated with the possible interfering signal using the third sampling rate as determined in the decision block 126 has moved to a non-interfering signal using the first sampling rate. If the energy associated with the possible interfering signal has moved to a non-interfering signal, the processor 31 determines that the possible interfering signal is not real. If the energy associated with the interfering signal is still associated with an interfering signal, the processor 31 determines that the possible interfering signal is real. If the processor 31 determines that the possible interfering signal is not real, the method 100 proceeds to the block 108. If the processor 31 determines that the possible interfering signal is real, the method 100 proceeds to the decision block 110.

In a more specific example, and referring to FIGS. 2-1 through 2-3, the first sampling rate Fs1 may be selected at the block 104 shown on FIG. 2-1 to be 100 MHz and the predetermined desired signal may be 60 MHz. With a sampling rate based on 100 MHz, a desired signal of 60 MHz is within a second Nyquist band. Since the sampling rate is only 100 mega samples per second (MSPS), which is the sampling rate corresponding to 100 MHz, the desired signal of 60 MHz is identified by looking for its alias at 40 MHz in a first Nyquist band during the processing that occurs at the block 108. In this example, the second sampling frequency Fs2 may be 101 MHz with a resulting 101 MSPS rate. At the decision block 110, the processor 31 determines whether a possible interfering signal exists at the 101 MSPS rate while using the 100 MSPS rate. An alias of the desired 60 MHz signal while sampling at 101 MSPS would be 41 MHz. While sampling at 100 MSPS, a 41 MHz signal may be an alias of a 59 MHz signal. So, at the decision block 110, the processor 31 determines whether a possible interfering signal exists by looking for the signal at 41 MHz while sampling at 100 MSPS.

If, at the decision block 110, the processor 31 determines that a possible interfering signal at 41 MHz does not exist, the Fs2 frequency of 101 MHz is used for a 101 MSPS sampling rate. The processor 31 then determines at the block 116 shown on FIG. 2-2 whether the desired 60 MHz signal is present by looking for its alias at 41 MHz. In this example, the third sampling frequency Fs3 may be 102.5 MHz with a corresponding 102.5 MSPS sampling rate. At the decision block 118, the processor 31 determines whether a possible interfering signal exists at the 102.5 MSPS rate while using the 101 MSPS rate. An alias of the desired 60 MHz signal while sampling at 102.5 MHz would be 42.5 MHz. While sampling at 101 MHz, a 42.5 MHz signal may be an alias of a 58.5 MHz signal. So, at the decision block 118, the processor 31 determines whether a possible interfering signal exists by looking for the signal at 42.5 MHz while sampling at O1 MHz.

If, at the decision block 118, the processor 31 determines that a possible interfering signal at 42.5 MHz does not exist, the Fs3 frequency of 102.5 MHz is used for a 102.5 MSPS sampling rate. At the block 124 shown on FIG. 2-3, the processor 31 then determines whether the desired 60 MHz signal is present by looking for its alias at 42.5 MHz. At the decision block 126, the processor 31 determines whether a possible interfering signal exists at the 100 MSPS rate while using the 102.5 MSPS rate. The processor 31 determines whether a possible interfering signal exists by looking for the signal at 40 MHz while sampling at 102.5 MHz. If the processor 31 determines that the possible interfering signal does not exist, the method 100 returns to the block 104 shown on FIG. 2-1.

If, at the decision block 110, 118, or 126 the processor 31 determines that a possible interfering signal exists, the method 100 proceeds to the decision blocks 128, 136, or 144 respectively. Determinations at the decision blocks 128, 136, and 144 are made in similar fashion to those at the decision blocks 110, 118, and 126. At the decision block 128, a 100 MSPS rate is used to look for a signal at 42.5 MHz. At the decision block 136, a 101 MSPS rate is used to look for a signal at 40 MHz. At the decision block 144, a 102.5 MSPS rate is used to look for a signal at 41 MHz. If, at any of the decision blocks 128, 136, or 144, a possible interfering signal is still found, a new sampling rate is still chosen at the blocks 130, 138, or 146 respectively. In each case, the processor 31 determines whether the possible interfering signal has moved to another frequency at the decision blocks 134, 142, or 150 respectively to determine whether the possible interfering signal is real.

In some examples, an energy level associated with the possible interfering signal found during the determination performed at the decision blocks 110, 118, or 126 is stored so that the stored energy level can be compared to energy levels of signals detected after sampling with the new sampling rate at the block 132, 140, or 148. So, if an energy of 1 milliwatt (mW) is detected at 41 MHz during the determination performed at the decision block 110 and a possible interfering signal also found at the decision block 128, the determination performed at the decision block 134 looks at the energy of any detected signal at 42 MHz because if the 41 MHz signal that was seen using the 100 MSPS rate came from the second Nyquist band, the 41 MHz signal would have come from an alias of a 59 MHz signal.

If the amount of energy at 42 MHz is 1 mW using the 101 MSPS rate, the processor 31 determines that it is the same energy that was seen at 41 MHz using the 100 MSPS rate and the processor 31 determines that the possible interferer is not real and the method 100 proceeds to the block 116. If, on the other hand, the amount of energy at 42 MHz is much less than 1 mW at the 101 MSPS rate, the processor 31 determines that what looked like 41 MHz at the 100 MSPS rate was actually coming from a signal at 41 MHz and that the energy is now aliased onto the desired channel. The processor 31 determines that the possible interferer is real and the method 100 proceeds to the decision block 118. The determinations performed at the decision blocks 142 and 150 proceed in similar fashion to that described with respect to the decision block 134. Although in this example, an energy measurement for a possible interfering signal was stored for the determination performed at the decision blocks 110, 118, and 126, in other examples, the energy measurement may be stored for the determination performed at the decision blocks 128, 136, and 144, with a different next sampling rate if the processor 31 determines that a possible interferer exists.

While the preferred embodiment of the invention has been illustrated and described, as noted above, many changes can be made without departing from the spirit and scope of the invention. For example, a desired signal and possible interfering signals may exist in other Nyquist bands. A desired signal may be in the first Nyquist band while interfering signals are aliases in the second Nyquist band. There may also be one or more desired channels in both the first and second Nyquist bands while possible interfering signal aliases are searched for in both the first and second Nyquist bands. More than two Nyquist bands may also be monitored by the system and method of the invention. If more than two Nyquist bands are monitored, the system may search for (total Nyquist bands−1) possible alias interferers per desired channel, for example. Differing numbers of sample rates may also be used, and the particular ordering of steps shown for the method may vary. Additionally, some of the method steps may be performed in parallel and the system may be configured to dwell for predetermined periods of time after performing some method steps. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A system for detecting a signal across multiple Nyquist bands, the system comprising:
    an analog to digital converter (ADC) configured to sample an input signal;
    a clock signal generator in signal communication with the ADC, the clock signal generator configured to selectively output a sample clock signal to the ADC, the sample clock signal having a sample frequency selected from a plurality of distinct sample frequencies; and
    a processor in signal communication with an output of the ADC and an input of the clock signal generator, the processor configured to:
    a) extract information from a predetermined desired signal within the sampled input signal;
    b) determine whether a possible signal that interferes with the desired signal exists at a next sampling rate selected from a plurality of sampling rates using a currently selected sampling rate;
    c) instruct the clock signal generator to generate the next sampling rate if the processor determines that the possible interfering signal does not exist;
    d) if the processor determines that the possible interfering signal does exist, determine whether the possible interfering signal exists at each of the other sampling rates selected from the plurality of sampling rates using the currently selected sampling rate until a sampling rate is found that does not have the possible interfering signal; and
    e) instruct the clock signal generator to generate the sampling rate that was determined to not have the possible interfering signal, if the processor determines that the sampling rate exists,
    wherein the processor is configured to repeat steps a) through e).

2. The system of claim 1, wherein the processor is further configured to:
    f) instruct the clock signal generator to generate another sampling rate selected from the plurality of sampling rates, other than the currently selected sampling rate, if the processor determines that none of the other sampling rates do not have the possible interfering signal;
    g) process the sampled input signal to determine if the possible interfering signal exists;
    h) return to step a) if the processor determines that the possible interfering signal does not exist; and
    i) return to step b) if the processor determines that the possible interfering signal exists.

3. The system of claim 2, wherein the processor is further configured to process the sampled signal to determine if the possible interfering signal exists in step g) by being configured to determine whether an amount of energy associated with the possible interfering signal using a previous sampling rate has moved to a non-interfering frequency using the currently selected sampling rate.

4. The system of claim 2, wherein the sampling frequency is selected from three of the plurality of distinct sample frequencies.

5. The system of claim 1, wherein the processor is further configured to process a sampled signal to extract information from a predetermined narrowband frequency in step a).

6. The system of claim 1, wherein the processor is further configured to determine whether the possible interfering signal exists in step b) by being configured to search for aliases of possible interferers using the currently selected sampling rate.

7. The system of claim 1, wherein the clock signal generator includes a switch controlled by the processor and a plurality of clock oscillators in signal communication with the switch such that the switch selectively outputs a signal from one of the clock oscillators to the ADC.

8. A distance measuring equipment (DME) system for detecting a DME signal across multiple Nyquist bands, the DME system comprising:
    an analog to digital converter (ADC) configured to sample an input signal;
    a clock signal generator in signal communication with the ADC, the clock signal generator configured to selectively output a sample clock signal to the ADC, the sample clock signal having a sample frequency selected from a plurality of distinct sample frequencies;
    a processor in signal communication with an output of the ADC and an input of the clock signal generator, the processor configured to:
    a) extract information from a predetermined desired DME signal from the sampled input signal;
    b) determine whether a possible signal that interferes with the desired DME signal exists at a next sampling rate selected from a plurality of sampling rates using a currently selected sampling rate;
    c) instruct the clock signal generator to generate the next sampling rate if the processor determines that the possible interfering signal does not exist;
    d) if the processor determines that the possible interfering signal does exist, determine whether the possible interfering signal exists at each of other sampling rates selected from the plurality of sampling rates using the currently selected sampling rate until a sampling rate is found that does not have the possible interfering signal; and e) instruct the clock signal generator to generate the sampling rate that was determined to not have the possible interfering signal, if the processor determines that the sampling rate exists, wherein the processor is configured to repeat steps a) through e).

9. The DME system of claim 8, wherein the processor is further configured to:
f) instruct the clock signal generator to generate another sampling rate selected from the plurality of sampling rates, other than the currently selected sampling rate, if the processor determines that none of the other sampling rates do not have the possible interfering signal;
g) process the sampled input signal to determine if the possible interfering signal exists;
h) return to step a) if the processor determines that the possible interfering signal does not exist; and
i) return to step b) if the processor determines that the possible interfering signal exists.

10. A method for determining a signal across multiple Nyquist bands, the method comprising:
a) sampling an input signal at a sampling rate selected from a plurality of distinct sampling rates using an analog to digital converter (ADC) to generate a sampled signal, the input signal having a frequency band larger than the Nyquist rate for the ADC;
b) processing the sampled signal to extract information from a predetermined desired signal from the sampled input signal;
c) determining whether a possible signal that interferes with the desired signal exists at a next sampling rate selected from the plurality of district sampling rates using a currently selected sampling rate;
d) sampling the input signal using the next sampling rate if it was determined that the possible interfering signal does not exist;
e) if it was determined that the possible interfering signal does exist, determining whether the possible interfering signal exists at each of other sampling rates selected from the plurality of distinct sampling rates using the currently selected sampling rate until a sampling rate is found that does not have the possible interfering signal;
f) sampling the input signal using the sampling rate that was determined to not have the possible interfering signal, if it was determined that the sampling rate exists; and
g) repeating steps b) through f).

11. The method of claim 10, further comprising:
h) sampling the input signal using another sampling rate selected from the plurality of distinct sampling rates, other than the currently selected sampling rate, if it was determined that none of the other sampling rates do not have the possible interfering signal;
i) processing the sampled signal to determine if the possible interfering signal exists;
j) returning to step b) if it is determined that the possible interfering signal does not exist; and
k) returning to step c) if it is determined that the possible interfering signal exists.

12. The method of claim 11, wherein processing the sampled signal to determine if the possible interfering signal exists in step i) includes determining whether an amount of energy associated with the possible interfering signal using a previous sampling sample rate has moved to a non-interfering signal using the currently selected sampling rate.

13. The method of claim 11, wherein the another sampling rate is selected from three of the plurality of distinct sampling rates.

14. The method of claim 13, wherein the three of the plurality of distinct sampling rates are not separated from each other by equal intervals.

15. The method of claim 10, wherein step b) includes processing the sampled signal to extract information from a predetermined narrowband frequency.

16. The method of claim 10, wherein step b) includes processing the sampled signal to identify a distance measuring equipment (DME) signal.

17. The method of claim 10, wherein step c) includes determining whether the possible interfering signal exists by searching for aliases of possible interfering signals using the currently selected sampling rate.

* * * * *

UNITED STATES PATENT AND TRADEMARK OFFICE
CERTIFICATE OF CORRECTION

PATENT NO.         : 8,064,560 B2
APPLICATION NO.    : 12/026479
DATED              : November 22, 2011
INVENTOR(S)        : Hunter et al.

Page 1 of 1

It is certified that error appears in the above-identified patent and that said Letters Patent is hereby corrected as shown below:

Claim 10, Column 9, line 32, please replace "plurality of district sampling rates" with --plurality of distinct sampling rates--.

Signed and Sealed this
Third Day of April, 2012

David J. Kappos
*Director of the United States Patent and Trademark Office*